(12) United States Patent
Yang

(10) Patent No.: US 7,915,100 B2
(45) Date of Patent: Mar. 29, 2011

(54) HYBRID ORIENTATION CMOS WITH PARTIAL INSULATION PROCESS

(75) Inventor: Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 12/246,597

(22) Filed: Oct. 7, 2008

(65) Prior Publication Data

US 2009/0035897 A1 Feb. 5, 2009

Related U.S. Application Data

(62) Division of application No. 10/958,717, filed on Oct. 5, 2004, now Pat. No. 7,439,542.

(51) Int. Cl.
*H01L 21/84* (2006.01)

(52) U.S. Cl. ........ 438/150; 438/152; 438/478; 438/481; 257/E21.413

(58) Field of Classification Search .................. 438/150, 438/152, 153, 154, 478, 481; 257/E21.413
See application file for complete search history.

(56) References Cited

U.S. PATENT DOCUMENTS

| 4,763,183 A | 8/1988 | Ng et al. |
| 4,933,298 A | 6/1990 | Hasegawa |
| 5,384,473 A | 1/1995 | Yoshikawa et al. |
| 5,731,217 A * | 3/1998 | Kadosh et al. ............... 438/300 |
| 6,998,684 B2 * | 2/2006 | Anderson et al. ............. 257/351 |
| 2004/0121507 A1 | 6/2004 | Bude et al. |

* cited by examiner

*Primary Examiner* — Michael Trinh
(74) *Attorney, Agent, or Firm* — Scully, Scott, Murphy & Presser, P.C.; Gail H. Zarick, Esq.

(57) ABSTRACT

The present invention provides a method of integrated semiconductor devices such that different types of devices are formed upon a specific crystallographic orientation of a hybrid substrate. In accordance with the present invention, junction capacitance of one of the devices is improved in the present invention by forming the source/drain diffusion regions of the device in an epitaxial semiconductor material such that they are situated on a buried insulating layer that extends partially underneath the body of the second semiconductor device. The second semiconductor device, together with the first semiconductor device, is both located atop the buried insulating layer. Unlike the first semiconductor device in which the body thereof is floating, the second semiconductor device is not floating. Rather, it is in contact with an underlying first semiconducting layer.

15 Claims, 4 Drawing Sheets

HYBRID ORIENTATION CMOS WITH PARTIAL INSULATION PROCESS

RELATED APPLICATIONS

The present application is a divisional of U.S. patent application Ser. No. 10/958,717, filed Oct. 5, 2004, which issued as U.S. Pat. No. 7,439,542 on Oct. 21, 2008.

FIELD OF THE INVENTION

The present invention relates to high-performance metal oxide semiconductor field effect transistors (MOSFETs) for digital or analog applications, and more particularly to MOSFETs utilizing carrier mobility enhancement from surface orientation.

BACKGROUND OF THE INVENTION

In present semiconductor technology, complementary metal oxide semiconductor (CMOS) devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2x-4x lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2x higher than on a (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above discussion, the (110) Si surface is optimal for pFET devices because of excellent hole mobility, yet such a crystal orientation is completely inappropriate for nFET devices. Instead, the (100) Si surface is optimal for NFET devices since that crystal orientation favors electron mobility.

Co-pending and co-assigned U.S. patent application Ser. No. 10/250,241, filed Jun. 17, 2003, provides an approach to fabricate CMOS devices on hybrid orientations wherein the pFETs are formed on a (110) surface orientation and nFETs are formed on a (100) surface orientation. Because hole mobility is greater than 150% higher on a (110) orientation than on a (100) orientation, the drive current of pFETs is greatly enhanced from conventional CMOS technology. However, this prior art approach puts one type of device on a silicon-on-insulator (SOI) and the other type of device on bulk (epitaxial layer) depending on the surface orientation of the SOI and the handle wafer. For example, with a (100) SOI and a (110) handle wafer, nFETs will be SOI devices and pFETs will be bulk-like devices. With a (110) SOI and a (100) handle wafer, nFETs will be bulk-like devices and pFETs will be SOI devices.

In general, bulk-like devices have larger junction capacitance than SOI devices and will affect circuit performance under AC conditions. Techniques are known which are capable of fabricating both types of devices on SOI, however the processing steps involved in these prior art techniques are very complicated.

In view of the above, there is a need to reduce the junction capacitance for the bulk-like device in the hybrid orientation structure using a simple process.

SUMMARY OF THE INVENTION

The present invention provides a method of integrating semiconductor devices such that different types of devices are formed upon a specific crystal orientation of a hybrid substrate that enhances the performance of each type of device. Specifically, the present invention provides a method of integrating semiconductor devices such that the pFETs are located on a (110) crystallographic plane, while the nFETs are located on a (100) crystallographic plane of a hybrid substrate. The method of the present invention also improves the performance of the device on an epitaxial semiconductor layer by reducing its junction capacitance using a source/drain diffusion layer on a buried insulator.

The method of the present invention can also be used in integrating different CMOS devices onto a substrate having different crystallographic surface planes wherein isolation regions are formed between CMOS devices.

The above are achieved in the present invention by utilizing a method in which a hybrid substrate comprising first and second semiconducting layers having different crystal orientations is first provided. After providing the hybrid substrate having different crystal orientations, the substrate is subjected to a first patterning and etching process which forms a first opening in the hybrid substrate that exposes a buried insulating layer that is located between the first and second semiconducting layers. A second patterning and etching process is then performed that forms a second opening within the hybrid substrate which exposes the underlying first semiconducting layer. The second opening is located in the area defined by the first opening. A semiconductor material having the first crystallographic orientation is regrown atop the exposed portion of the first semiconducting layer by epitaxy and a planarization process follows which provides a substrate that has substantially coplanar surfaces having different crystallographic planes. In particular, the substrate has a first crystallographic plane comprising the regrown semiconductor material that has the first crystallographic orientation and a second crystallographic plane comprising the second semiconducting layer which has the second crystallographic orientation. In both planes, subsequently formed semiconductor devices such as FETs will both be located on SOI-like areas.

In broad terms, the present invention provides a method of forming CMOS devices on a hybrid substrate with reduced junction capacitance for the bulk-like devices that comprises the steps of:

providing a hybrid substrate comprising a first semiconducting layer of a first crystallographic orientation, a buried insulating layer located on a surface of the first semiconducting layer and a second semiconducting layer of a second crystallographic orientation which is different from the first crystallographic orientation located on said buried insulating layer;

forming a first opening in said hybrid substrate, said first opening exposes a surface of the buried insulating layer, wherein said first opening defines a second area, said second area is located next to a first area;

forming a second opening within said first opening that exposes a surface of the first semiconducting layer;

growing a semiconductor material on said first semiconducting layer in said second opening by epitaxy, said semiconductor material having the first crystallographic orientation;

planarizing the hybrid substrate containing the semiconductor material so that an upper surface of the second semiconducting layer is substantially coplanar with an upper surface of the semiconductor material; and forming at least one first semiconductor device in said first area, while forming at least one second semiconductor device on said semiconductor material in said second area.

In accordance with the present invention, the first semiconductor device may be a pFET with the second crystallographic orientation is (110) or (111), while the second semiconductor device may be an nFET with the first crystallographic orientation is (100) or (111). It is also possible in the present invention, that the first semiconductor device is an nFET with the second crystallographic orientation is (100) or (111) and that the second semiconductor device is a pFET with the first crystallographic orientation is (110) or (111). In one embodiment of the present invention, the method future includes forming isolation regions between the first area and the second area. In yet another embodiment of the present invention, the order of forming the first and second openings is reversed such that the second opening is formed prior to forming the first opening.

It should be noted that the crystallographic orientations mentioned above are exemplary and that any crystallographic orientation can be used. As stated above, the second semiconducting layer and the regrown semiconductor material include upper surfaces that are substantially coplanar. In accordance with the present invention, both devices are formed on a SOI-like region and the second semiconductor device formed atop the epitaxially grown semiconductor material has reduced junction capacitance since the source/drain diffusion regions of the second semiconductor device are located within the regrown semiconductor material and they are located on a portion of the buried insulating layer. Note that the second semiconductor device is not floating, i.e., the body of the second semiconductor device located on the epitaxial semiconductor material is in contact with the underlying first semiconducting layer through the second opening.

In broad terms, the inventive structure provided by the above processing steps comprises:

a substrate comprising a second semiconducting layer of a second crystallographic orientation that has an upper surface that is coplanar with an upper surface of an epitaxial semiconductor material of a first crystallographic orientation, said first crystallographic orientation is different from said second crystallographic orientation, wherein a buried insulating layer is located beneath said second semiconducting layer and a portion of the epitaxial semiconductor material; and a first semiconductor device located on said second semiconducting layer and a second semiconductor device located on said epitaxial semiconductor material, wherein said second semiconductor device includes source and drain diffusion regions that are located on said buried insulating layer that is beneath said epitaxial semiconductor material, wherein a body portion of the second semiconductor device is not floating.

By not "floating", it is meant that the body of the second semiconductor device located within the epitaxial semiconductor material is in contact with a first semiconducting layer that is located beneath the buried insulating layer.

DETAILED DESCRIPTION OF THE INVENTION

Figure 1:
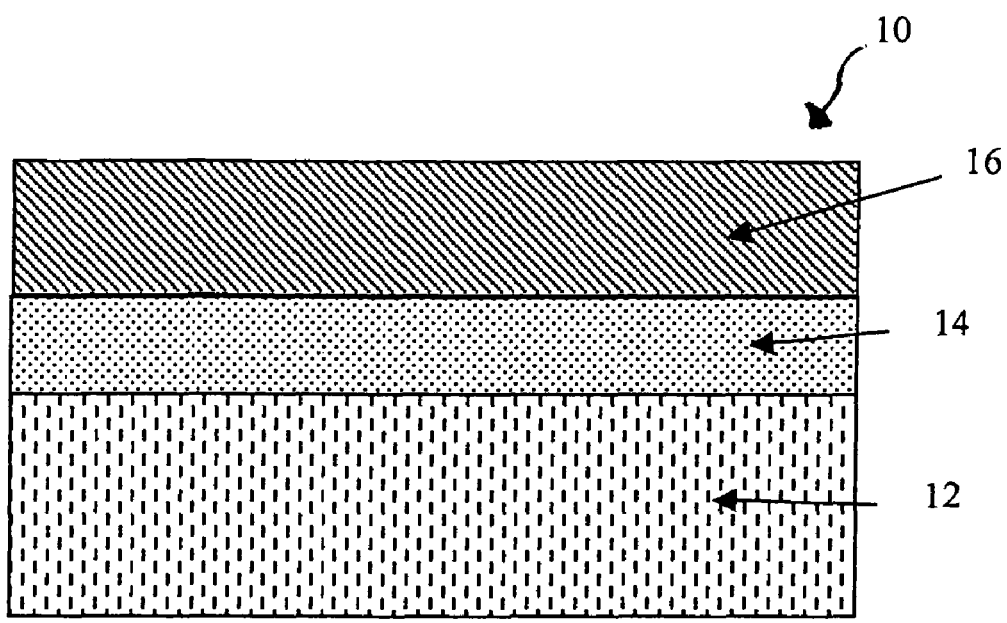
FIG. 1 is a pictorial representation (through a cross sectional view) showing a hybrid substrate that has different surface orientations which can be used in the present invention.

The present invention, which provides a method of fabricating CMOS devices with reduced junction capacitance on a hybrid substrate having first and second semiconducting layers of different crystal orientations, will now be described in greater detail by referring to the drawings that accompany the present application. It is noted that the drawings provided in the present invention are for illustrative purposes and thus they are not drawn to scale.

In the drawings, the final hybrid substrate has upper coplanar regions of different crystallographic orientation.

Referring to FIG. 1, there is shown an initial hybrid substrate 10 that is employed in the present invention. The hybrid substrate 10 comprises a first (or bottom) semiconducting layer 12, a buried insulating layer 14 located on a surface of the first semiconducting layer 12, and a second (or top) semiconducting layer 16 located on a surface of the buried insulating layer 14. In accordance with the present invention, the first semiconducting layer 12 of the hybrid substrate 10 comprises a first semiconducting material that has a first crystallographic orientation and the second semiconducting layer 16 of the hybrid substrate 10 comprises a second semiconducting material that has a second crystallographic orientation that differs from the first crystallographic orientation.

The first semiconducting layer 12 of the hybrid substrate 10 is comprised of any semiconducting material including, for example, Si, SiC, SiGe, SiGeC, Ge, GaAs, InAs, InP as well as other III/V or II/VI compound semiconductors. Combinations of the aforementioned semiconductor materials are also contemplated herein. The first semiconducting layer 12 may be unstrained, strained or a combination of strained and unstrained layers. The first semiconducting layer 12 is also characterized as having a first crystallographic orientation which may be (110), (111), (100) or any other crystallographic orientation.

The first semiconducting layer 12 serves as a handle wafer, and its thickness is close to the thickness of a standard wafer.

The second semiconducting layer 16 is comprised of any semiconducting material which may be the same or different from that of the first semiconducting layer 12. Thus, the second semiconducting layer 16 may include, for example, Si, SiC, SiGe, SiGeC, Ge, GaAs, InAs, InP as well as other III/V or II/VI compound semiconductors. The second semiconducting layer 16 may be unstrained, strained or a combination of strained and unstrained layers. The second semiconducting layer 16 may also include combinations of the aforementioned semiconducting materials.

The second semiconducting layer 16 is also characterized as having a second crystallographic orientation that is different from the first crystallographic orientation. Thus, the crystallographic orientation of the second semiconducting layer 16 is (100), (111), (110) or any other crystallographic orientation with the proviso that the crystallographic orientation of the second semiconducting layer 16 is not the same as the crystallographic orientation of the first semiconducting layer 12.

The second semiconducting layer 16 may have a thickness from about 5 nm to about 2 μm, with a thickness from about 10 nm to about 100 nm being more typical. For smaller junction/parasitic capacitance, a thinner second semiconductor layer 16 is desired.

The buried insulating layer 14 that is located between the first and second semiconducting layers (12 and 16) of the hybrid substrate 10 can be an oxide, nitride, oxynitride or any combination of these insulating materials. In some embodiments, the buried insulating layer 14 is an oxide. The buried insulating layer 14 typically has a thickness from about 20 nm to 500 nm, with a thickness of from about 40 nm to 200 nm being more typical.

The hybrid substrate 10 shown in FIG. 1 is formed utilizing a layer transfer process in which bonding is employed. Specifically, the layer transfer process disclosed in co-pending and co-assigned U.S. application Ser. No. 10/250,241, filed Jun. 17, 2003 can be used. The entire content of the '241 application is incorporated herein by reference.

The semiconducting layers (12 and 16) used in fabricating the hybrid substrate 10 may include two SOI wafers wherein one of the wafers includes the first semiconducting layer 12 and the other wafer includes the second semiconducting layer 16; an SOI wafer and a bulk semiconductor wafer; two bulk semiconductor wafers in which at least one of the wafers contains an insulating layer 14 thereon. The bulk wafers may include an ion implant region, such as a $H_2$ implant region, which can be used to split a portion of at least one of the wafers during bonding. A surface dielectric may be present on the wafer that includes the second semiconductoing layer 16.

Bonding is achieved by first bringing the two semiconducting wafers into intimate contact with other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature from about 600° C. to about 1300° C. for a time period from about 2 hours to about 20 hours. More typically, the bonding used in forming the hybrid substrate 10 is performed at a temperature from about 900° C. to about 1200° C.

The term "inert ambient" is used in the present invention to denote an atmosphere in which an inert gas, such as He, Ar, $N_2$, Xe, Kr or a mixture thereof is employed. A preferred ambient used during the bonding process is $N_2$.

In the embodiment where two SOI wafers are employed, some material layers of at least one of the SOI wafers may be removed after bonding utilizing a planarization process such as chemical mechanical polishing (CMP) or grinding and etching.

In the embodiment in which one of the wafers includes an ion implant region, the ion implant region forms a porous region during bonding which causes a portion of the wafer above the ion implant region to break off leaving the hybrid substrate 10 such as is shown, for example, in FIG. 1. The implant region is typically comprised of $H_2$ ions that are implanted into the surface of the wafer utilizing ion implantation conditions that are well known to those skilled in the art. The layer splitting occurs at the implant region during a 350° C.-500° C. anneal after an initial heating step that is performed at a temperature from about 200° C. to about 500° C. directly after bonding.

In embodiments where the wafers to be bonded do not include a surface dielectric layer therein, the surface dielectric layer 18 may be formed atop the hybrid substrate 10 by a thermal process, such as oxidation, or by a conventional deposition process such as chemical vapor deposition (CVD), plasma-enhanced CVD, atomic layer deposition, chemical solution deposition as well as other like deposition processes. The dielectric layer 18 serves as a mask for subsequent selective epitaxy. The structure including the surface dielectric layer 18 is shown, for example, in FIG. 2. The surface dielectric layer 18 typically has a thickness from about 5 nm to about 500 nm, with a thickness from about 20 nm to about 100 nm being more typical. It is again noted that the surface dielectric layer 18 can be present on the surface of the wafer including the second semiconducting layer 16 prior to bonding as well.

Figure 2:
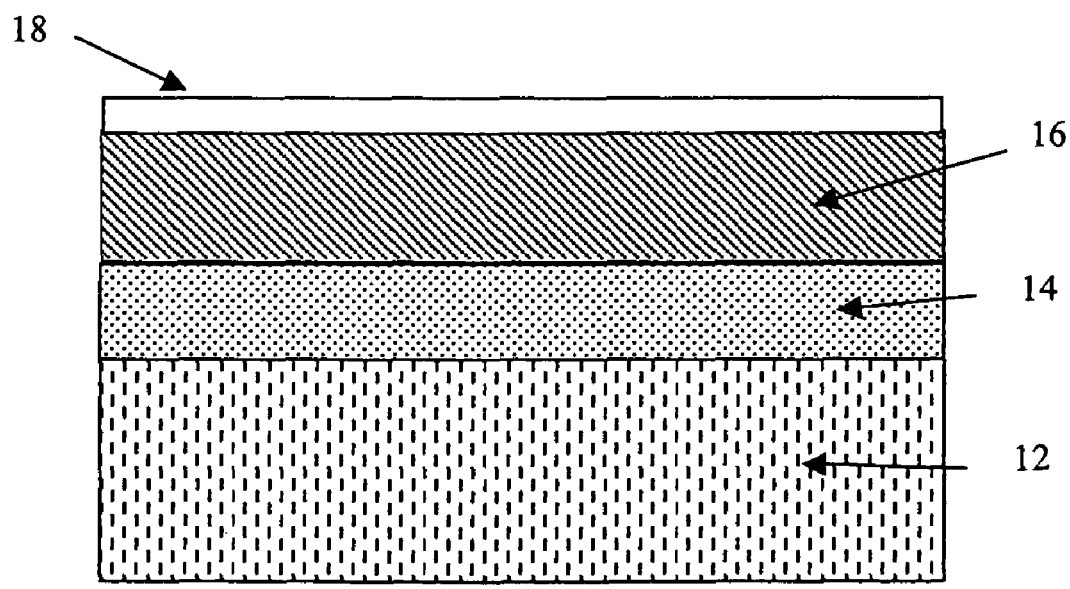
FIG. 2 is a pictorial representation (through a cross sectional view) showing the hybrid substrate of FIG. 1 after forming a surface dielectric layer 18 on the substrate.

A first mask 20 is then formed on a predetermined portion of the hybrid substrate 10 shown in FIG. 2 so as to protect a portion of the hybrid substrate 10, while leaving another portion of the hybrid substrate 10 unprotected. The protected portion defines a first area (or region) 23 of the structure, whereas the unprotected portion defines a second area (or region) 22. First mask 20 can be a photoresist patterned by lithography, which includes the steps of applying, exposing and developing. The photoresist usually is removed after pattern transfer. The first mask 20 may also be hard material such as a nitride, oxynitride or an oxide layer that is formed and patterned utilizing deposition, lithography and etching.

Figure 3:
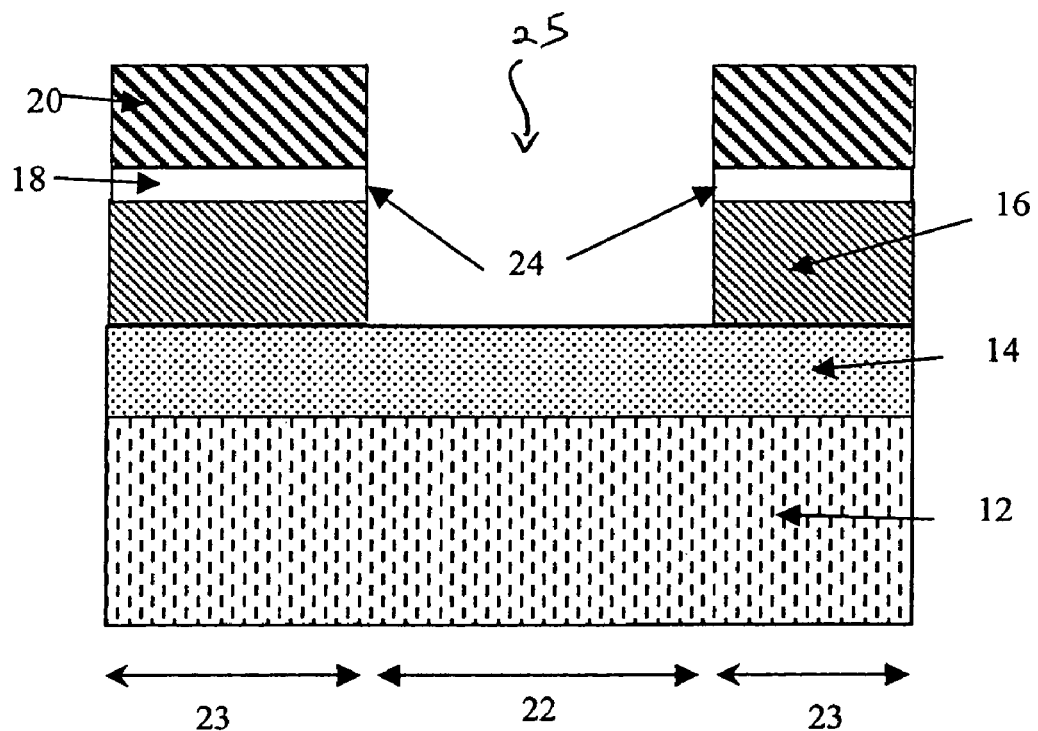
FIG. 3 is a pictorial representation (through a cross sectional view) showing a first opening formed in the substrate of FIG. 2 so as to expose a portion of the buried insulating layer.

After providing the first mask 20, the structure is subjected to one or more etching steps so as to expose the surface of the buried insulating layer 14. The etching may include a dry etching process such as reactive-ion etching, ion beam etching, plasma etching or laser etching, a wet etching process wherein a chemical etchant is employed or any combination thereof. In one preferred embodiment of the present invention, reactive-ion etching (RIE) is used in this step of the present invention. The structure formed after the etching step has been performed is shown, for example, in FIG. 3. The structure includes a first opening 25 defined by the first patterning and etching process defined above which exposes a surface of the buried insulating layer 14. It is noted that the first opening 25 is located within the second area 22 of structure. As shown in FIG. 3, the sidewalls 24 within the first opening 25 are bare at this point of the inventive process.

Figure 4:
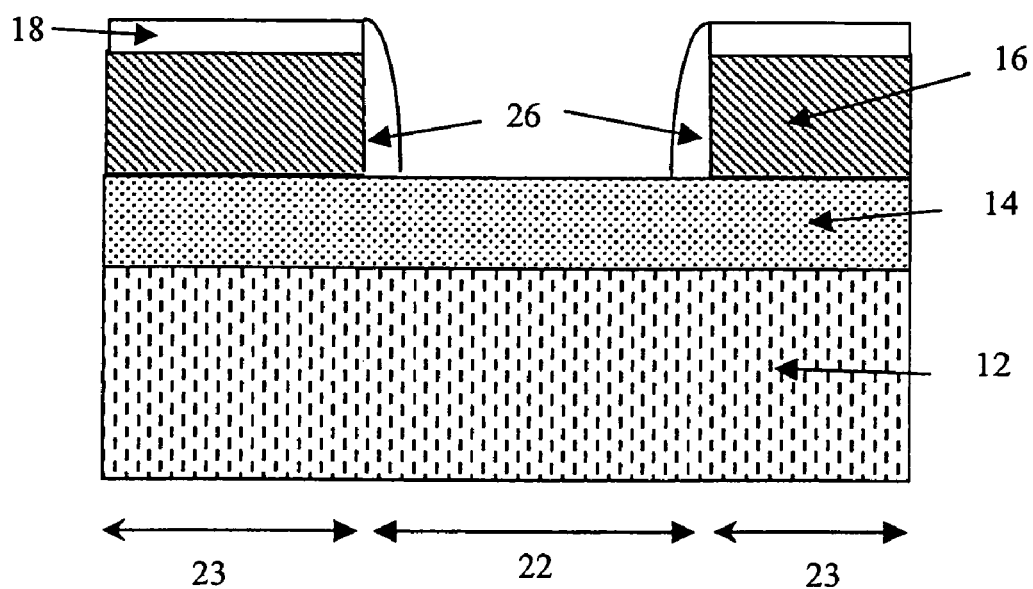
FIG. 4 is a pictorial representation (through a cross sectional view) showing the structure of FIG. 3 after removing the patterned mask and forming spacers in said first opening.

Next, an optional spacer 26 can be formed in the first opening 25 on the exposed sidewall 24 of at least the patterned and etched second semiconducting layer 16 provided by the above processing steps. The optional spacer 26 is formed by deposition and etching. The optional spacer 26 can be comprised of an insulating material such as, for example, an oxide, nitride, oxynitride or any combination thereof. The optional spacer 26 may be a single spacer, as shown, or it may comprise multiple spacers. FIG. 4 shows the presence of the optional spacers 26 in the structure after removing the first mask 20. The optional spacer 26 is used in the present invention to prevent epitaxy from the sidewall 24 of the semiconducting layer 16 to ensure high quality single grain crystals in the second region 22. It is noted that although the drawings in the subsequent process sequence show the presence of the optional spacer 26 the process flow works equally well when the optional spacers 26 are not present.

Figure 5:
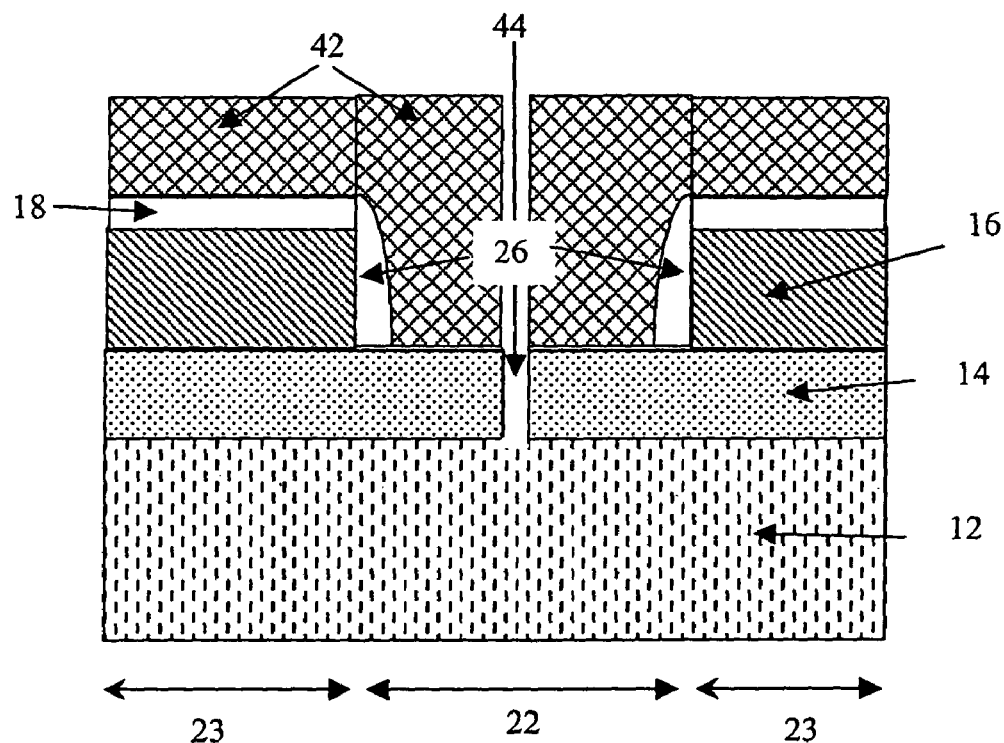
FIG. 5 is a pictorial representation (through a cross sectional view) showing a second opening formed in the structure of FIG. 4 so as to expose a portion of the bottom semiconductor layer.

Next, a second mask 42 is formed on the structure using a similar approach as the first mask 20 and following a subsequent etch that exposes a portion of the first semiconducting layer 12 the structure shown in FIG. 5 is provided. The structure shown in FIG. 5 includes a second opening 44. The size of the second opening 44 in the second area 22 is determined by the channel. The second opening 44 can be smaller or slightly larger than the channel (or gate conductor). In the present invention, the second opening 44 is preferred to be centered with the channel. There can be multiple channel regions within the second area 22 although only one is shown in FIG. 5. Using the second mask 42, the first semiconducting layer 12 is exposed by a subsequent etching step. After pattern transfer the second mask 42 is removed.

An optional spacer (not shown) can be formed after the second opening 44 is formed.

The sequence of forming the second opening 44 and first opening 25 used in defining second area 22 can be reversed, i.e., the second mask 42 can be applied first to define second opening 44, and the first mask 20 is then applied to define second region 22. Similar pattern transfer technique can be used as described above.

Semiconductor material 50 is then epitaxially grown from the exposed surface of the first semiconducting layer 12. In accordance with the present invention, the semiconductor material 50 has a crystallographic orientation that is the same as the crystallographic orientation of the first semiconducting layer 12. Although this epitaxial semiconductor material 50 will have the same surface orientation as the first semiconducting layer 12, it can be of a different semiconductor material than the first semiconducting layer 12.

The epitaxial semiconductor material 50 may comprise any semiconductor material, such as Si, strained Si, SiGe, SiC, SiGeC or combinations thereof, which is capable of being formed utilizing a selective epitaxial growth method. The epitaxial material 50 can be strained, unstrained or a combination thereof. In one embodiment, the epitaxial semiconductor material 50 is an unstrained semiconductor material.

Figure 6:
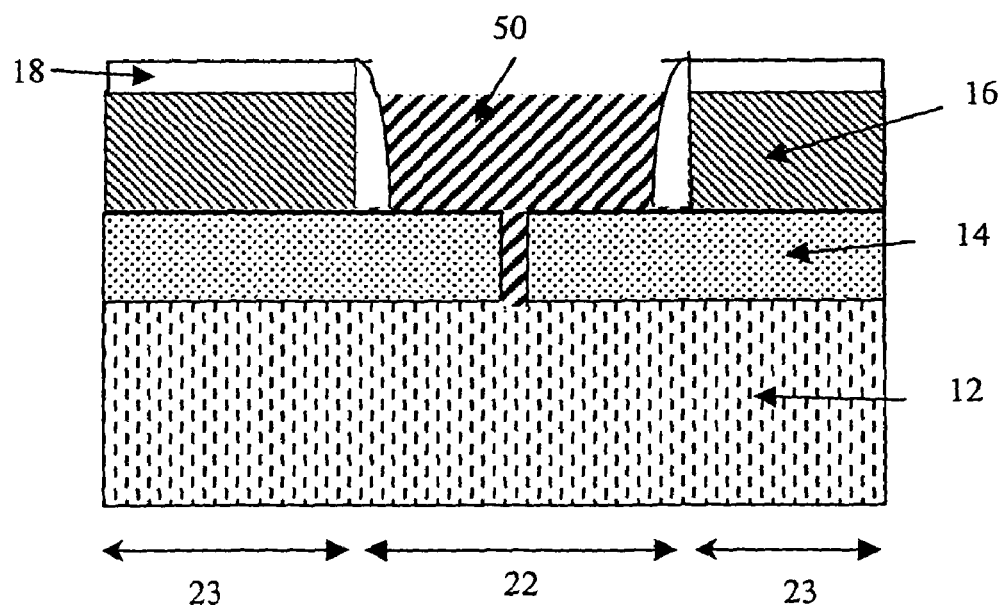
FIG. 6 is a pictorial representation (through a cross sectional view) illustrating the structure of FIG. 5 after a semiconductor material is grown from the exposed surface of the bottom semiconductor layer.

To achieve a high quality epitaxial semiconductor material 50, selective epitaxy is recommended where there is no polysilicon or amorphous silicon formed on top of the surface dielectric layer 18. The regrown semiconductor material 50 should be grown thick enough so that the lateral growth portion can fill up the whole of area 22 including the second opening 44. To eliminate a facet formation during the epitaxy, the regrown semiconductor material 50 can be grown, in some embodiments, higher than the surface dielectric layer 18, then polished down to the surface dielectric layer 18, and finally recessed to be coplanar with the top surface of the second semiconductor layer 16. The structure after semiconductor material regrowth is shown in FIG. 6

Following the removal of the surface dielectric layer 18 and the formation of a substantially coplanar surface, isolation regions 68, such as shallow trench isolation regions, are typically formed so as to isolate the first region 23 from the second region 22, and isolate devices within the same region. The isolation regions 68 are formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

Figure 7:
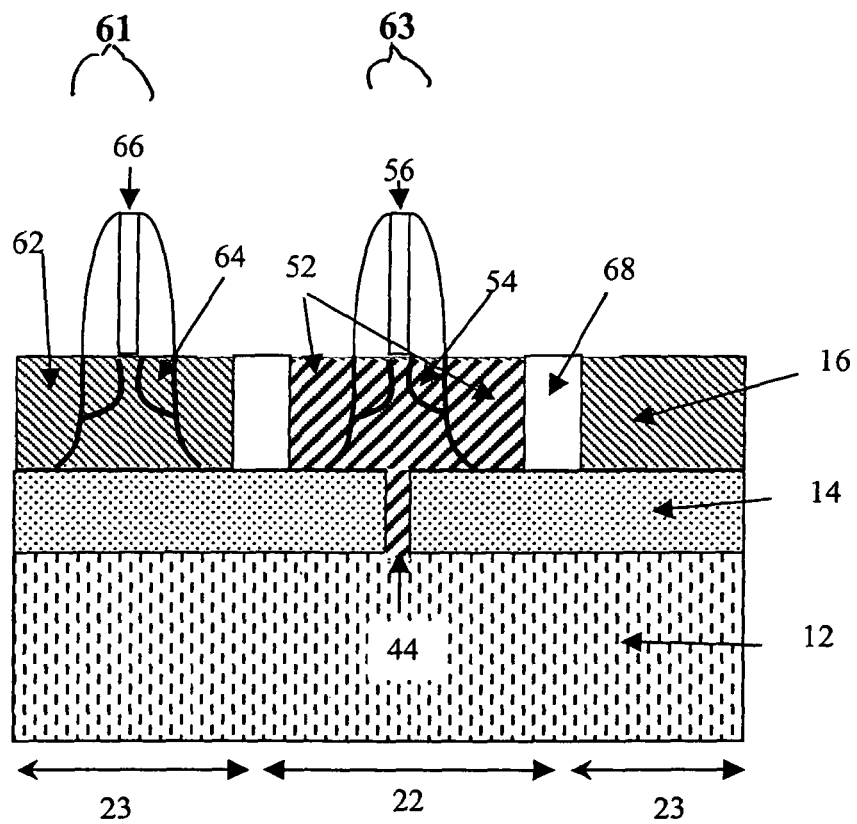
FIG. 7 is a pictorial representation (through a cross sectional view) illustrating the integrated semiconductor structure of the present invention containing an nFET and a pFET formed on a coplanar surface of different crystallographic orientations. The source/drain of the device on the epitaxial semiconductor material are on the buried insulating layer and thus the junction capacitance is reduced.

The resultant substantially coplanar structure containing isolation region 68 is shown, for example in FIG. 7. As shown, the structure of FIG. 7 includes an exposed second semiconducting layer 16 of a second crystal orientation and an epitaxial semiconductor material 50 that has the same crystal orientation as that of the first semiconducting layer 12.

FIG. 7 also shows the integrated structure that is formed after a first semiconductor device 61 is formed on a portion of the first area 23 and a second semiconductor device 63 is formed on the epitaxial semiconductor material 50 in the second area 22. Despite showing the presence of only one device in each region, the present invention contemplates forming a plurality of each type of device in the specific device region. In accordance with the present invention, the first semiconductor device 61 may be a pFET or an nFET, whereas the second semiconductor device 63 may be an nFET or a pFET, with the proviso that the first semiconductor device 61 is different from the second semiconductor device 63 and that the specific device is fabricating on a crystal orientation that provides high performance.

The pFETs and nFETs are formed utilizing standard CMOS processing steps that are well known to those skilled in the art. Each FET includes a gate dielectric, a gate conductor (labeled as 66 and 56), spacers located on the sidewalls of at least the gate conductor, and the source/drain diffusion regions (labeled as 52, 62). Note that pFET is formed over the semiconductor material having a (110) or (111) orientation, whereas the nFET is formed over a semiconductor having a (100) or (111) orientation. Regions 64 and 54 are source/drain extension regions.

To reduce the junction capacitance for the second semiconductor device 63 on the epitaxial material, the diffusion regions 52 are located on top of the buried insulating layer 14. To achieve this, the gate conductor 56 should be centered to the now filled opening 44. The width of the now filled opening 44 can be smaller than the gate conductor 56. Note that the size of the filled opening 44 is determined by the channel region. In the present invention, the now filled opening 44 is preferred at least as large as the gate conductor width in order to reduce the amount of epitaxial growth. However, the now filled opening 44 should be small enough so that at least most of the diffusion region 52 is on the buried insulating layer 14.

The doping of the first semiconducting layer 12 and the epitaxial semiconductor material 50 can be the same type depending on the type of the device. For example, when the device 63 is pFET on (110) orientation, n-type doping is desired. In this case, the body of device 63 is connected to the bottom of the wafer through opening 44. Unlike a regular SOI device, the body of device 63 is not floating, although its source/drain region 52 are on a buried insulating layer.

In another embodiment when floating body is desired, the epitaxial semiconductor material 50 can be doped to the opposite type from the bottom semiconductor 12. For example, when the device 63 is pFET on (110) orientation, the epitaxial semiconductor material 50 can be doped to n-type as n-well and the bottom semiconducting layer 12 can be p-type. In this case the n-well of the pFET 63 is floating. Device operation range is limited, however, so that no forward bias of the floating well can occur to prevent leakage current.

Doping of the epitaxial semiconductor material 50 can be done in-situ with the epitaxy process or can be done during the well implantation before the gate stack formation in the standard CMOS process.

Figure 8:
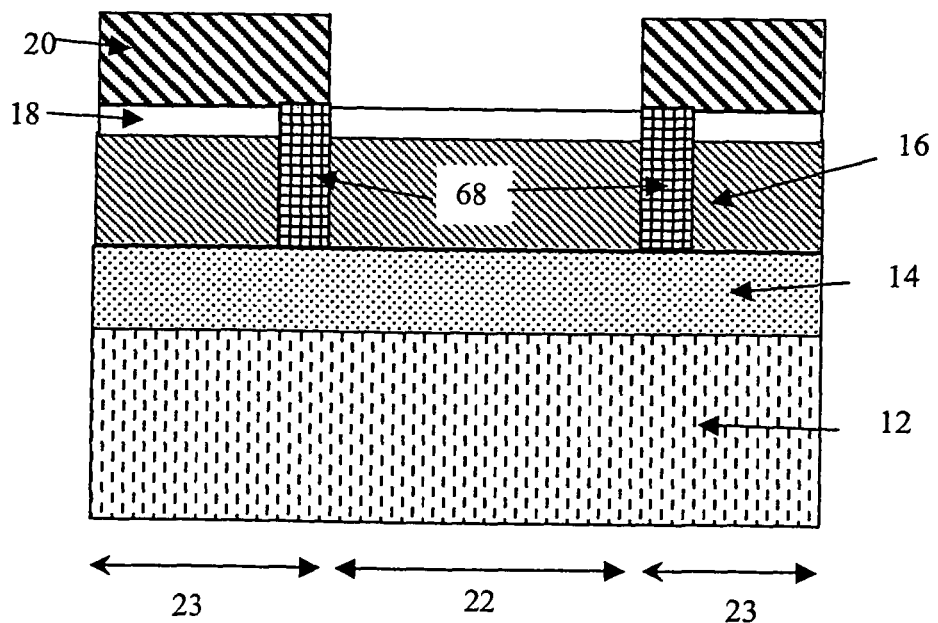
FIG. 8 is a pictorial representation (through a cross sectional view) illustrating another hybrid substrate that can be used in the present invention in which the device isolation regions are formed prior to regrowing the semiconductor material.

In the above embodiment, the device isolation is performed after epitaxy and surface planarization. In another embodiment (See FIG. 8), the device isolation 68 can be done first on the hybrid substrate 10 prior to applying mask 20 or 42. In this case, the surface dielectric layer 18 also serves as chemical mechanical polishing stop layer for the isolation region 68. The processing described above then can be performed. Note that is the structure of FIG. 8 is employed, there is no need to form the optional spacers 26.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

What is claimed is:

1. A method of forming an integrated semiconductor structure comprising:

providing a hybrid substrate comprising a first semiconducting layer of a first crystallographic orientation, a buried insulating layer located on a surface of the first semiconducting layer and a second semiconducting layer of a second crystallographic orientation which is different from the first crystallographic orientation located on said buried insulating layer;

forming a first opening that exposes a surface of the first semiconducting layer;

forming a second opening in said hybrid substrate that exposes a surface of the buried insulating layer after forming said first opening, wherein said second opening defines a second area, that is located next to a first area, wherein said second opening has a greater area than an entirety of said first opening and includes all areas of said entirety of said first opening;

growing a semiconductor material having the first crystallographic orientation on said first semiconducting layer in said first opening by epitaxy;

planarizing the hybrid substrate containing the semiconductor material so that an upper surface of the second semiconducting layer is substantially coplanar with an upper surface of the semiconductor material; and forming at least one first semiconductor device in said first area, while forming at least one second semiconductor device on said semiconductor material in said second area.

2. The method of claim 1 wherein said providing the hybrid substrate comprises a layer transfer process that includes at least a bonding step.

3. The method of claim 2 wherein said bonding step is achieved by bringing two wafers into intimate contact, optionally applying an external force, and heating.

4. The method of claim 1 wherein said hybrid substrate further includes a surface dielectric layer.

5. The method of claim 1 wherein said first opening is formed by lithography and etching.

6. The method of claim 5 wherein said second opening is formed by lithography and etching.

7. The method of claim 1 wherein said first semiconductor device is a pFET with the second crystallographic orientation is (110) or (111) and said second semiconductor device is an nFET with the first crystallographic orientation is (100) or (111).

8. The method of claim 1 wherein said first semiconductor device is an nFET with the second crystallographic orientation is (100) or (111) and said second semiconductor device is a pFET with the first crystallographic orientation is (110) or (111).

9. The method of claim 1 wherein said second semiconductor device includes a body and source and drain diffusion regions, said source and drain diffusion regions are located atop said buried insulating layer which extends beneath a portion of the semiconductor material and said body is in contact with said first semiconducting layer through said second opening.

10. The method of claim 1 wherein said first opening has a lesser area than an entirety of said second opening, and a horizontal top surface of said buried insulator layer is exposed after said first and second openings are formed.

11. The method of claim 10 wherein said horizontal top surface of said buried insulator layer contacts an entirety of a periphery at an upper end of said first opening.

12. The method of claim 1 wherein sidewalls of said first opening are laterally offset from sidewalls of said second opening.

13. The method of claim 1 further comprising forming a spacer after forming said second opening.

14. The method of claim 1 wherein said semiconductor material is grown over, and contacts, a top surface of said buried insulating layer within said first area.

15. A method of forming an integrated semiconductor structure comprising:

providing a substrate containing a stack, from bottom to top, a first semiconductor layer having a first crystallographic orientation, a buried insulating layer, and a second semiconducting layer having a second crystallographic orientation and a first upper surface, wherein said second crystallographic orientation is (110) or (111), and said first crystallographic orientation is different from said second crystallographic orientation;

removing a portion of said second semiconductor layer and exposing a top surface of said buried insulator layer;

forming a opening through said buried insulator layer, wherein a top surface of said first semiconductor layer is exposed at a bottom of said opening;

forming a first epitaxial semiconductor material portion and a second epitaxial semiconductor material portion, wherein said second epitaxial semiconductor material portion fills said opening in said buried insulator layer and is epitaxially aligned to said first epitaxial semiconductor material portion, said first semiconductor material portion is formed over a top surface of said buried insulator layer and is epitaxially aligned to said second epitaxial semiconductor material portion; and forming a first semiconductor device on said second semiconducting layer and a second semiconductor device on said first epitaxial semiconductor material portion, wherein said second semiconductor device includes source and drain diffusion regions that are located on said buried insulating layer, wherein a body portion of said second semiconductor device is in contact with said second epitaxial semiconductor material portion, wherein said opening has a width that is at least as great or smaller than a width of a gate conductor of said second semiconductor device.

* * * * *